United States Patent
Tseng

[11] Patent Number: 6,015,744
[45] Date of Patent: Jan. 18, 2000

[54] METHOD OF MANUFACTURING A SHALLOW TRENCH ISOLATION ALIGNMENT MARK

[75] Inventor: Chin-Hung Tseng, Hsinchu, Taiwan

[73] Assignee: United Silicon Incorporated, Hsinchu, Taiwan

[21] Appl. No.: 09/186,544

[22] Filed: Nov. 5, 1998

[30] Foreign Application Priority Data

Jul. 27, 1998 [TW] Taiwan ................................. 8711218

[51] Int. Cl.$^7$ ............................ H01L 21/76; H01L 21/30
[52] U.S. Cl. ......................... 438/401; 438/462; 438/800; 257/797
[58] Field of Search ................................... 438/401, 462, 438/800, 975; 257/797, 798

[56] References Cited

U.S. PATENT DOCUMENTS

| | | | |
|---|---|---|---|
| 5,852,497 | 8/1997 | Pramanik et al. ....................... | 356/401 |
| 5,893,744 | 1/1997 | Wang ....................................... | 438/401 |

Primary Examiner—Charles Bowers
Assistant Examiner—Craig Thompson
Attorney, Agent, or Firm—Jiawei Huang; J.C. Patents

[57] ABSTRACT

A method of manufacturing a shallow trench isolation alignment mark comprises the steps of first providing a silicon wafer whose surface has an alignment mark formed thereon. Next, a silicon nitride layer is formed over the silicon wafer, and then shallow trenches are formed. At least one of the shallow trenches is positioned at a distance of about 2000 Å to 10000 Å from the edge of the alignment mark. Thereafter, an oxide layer is formed over the silicon nitride layer, and then a chemical-mechanical polishing operation is conducted to remove a portion of the oxide layer and silicon nitride layer above the alignment mark. Altogether, a layer of silicon nitride having a thickness of about 600 Å is removed from the top of the alignment mark. Finally, the silicon nitride layer is also removed. By forming a shallow trench at a distance of between 2000 Å to 10000 Å from the edge of an alignment mark, accurate overlaying of mask can be achieved without the need for performing additional oxide clearout operations.

10 Claims, 5 Drawing Sheets

METHOD OF MANUFACTURING A SHALLOW TRENCH ISOLATION ALIGNMENT MARK

CROSS-REFERENCE TO RELATED APPLICATION

This application claims the priority benefit of Taiwan application serial no. 87112218, filed Jul. 27, 1998, the full disclosure of which is incorporated herein by reference.

BACKGROUND OF THE INVENTION

1. Field of Invention

The present invention relates to a method of manufacturing semiconductors. More particularly, the present invention relates to a method of manufacturing a shallow trench isolation alignment mark.

2. Description of Related Art

FIG. 1 is a schematic sketch of a silicon wafer. In FIG. 1, a silicon wafer 2 that includes a first alignment mark 4, a second alignment mark 6 and a main circuit area 8 is provided. The main circuit area 8 includes a number of semiconductor devices (not shown) and integrated circuit regions. The first and the second alignment marks 4 and 6 are positioned near the edge of the wafer 2, and the main circuit area 8 is positioned near the center of the wafer 2. With this arrangement, the first and the second alignment marks 4 and 6 can avoid the central region so that the level of integration in the main circuit region 8 will not be reduced. Furthermore, during the process of fabricating the semiconductor wafer, photomasks must be aligned accurately with respect to the alignment marks 4 and 6 before the main circuit region 8 can be properly formed.

FIGS. 2A through 2F are schematic cross-sectional views taken along line X—X' of FIG. 1 showing the progression of manufacturing steps in producing an alignment mark on a wafer according to a conventional method.

First, as shown in FIG. 2A, a silicon wafer 2 is provided. On the wafer surface 2, an alignment mark 4 having an array profile is formed.

Next, as shown in FIG. 2B, a silicon nitride layer 14 is formed over the wafer 2. Preferably, the silicon nitride layer 14 is formed using a low-pressure chemical vapor deposition (LPCVD) method. Since the silicon nitride layer 14 formed by the LPCVD has good step coverage, an array profile can still be maintained in the silicon nitride layer 14 above the alignment mark 4. Thereafter, shallow trenches (not shown in the FIG.) are formed in the main circuit region 8 of the wafer 2 (FIG. 1). In the conventional method, no shallow trenches are formed around the alignment mark 4 area. The method of forming shallow trenches includes using, for example, photolithographic and dry etching operations. With reference to FIG. 1, note that no shallow trenches are formed on the surface of the wafer 2 outside the main circuit area 8. Consequently, no shallow trenches are found close to the alignment mark 4. Distance of the alignment mark 4 from the main circuit area 8 is roughly more than 2 to 5 times the distance between two neighboring semiconductor devices within the main circuit region 8.

Next, as shown in FIG. 2C, an oxide layer 16 is formed over the silicon nitride layer 14. Preferably, the oxide layer 16 is formed using an atmospheric pressure chemical vapor deposition (APCVD) method. For example, tetra-ethyl-ortho-silicate (TEOS) can be used as a reactive agent for forming the oxide layer 16. In general, the oxide layer 16 has good step coverage, and hence an array profile can be maintained in the oxide layer 16 above the alignment mark 4. Since no shallow trenches are formed near the alignment mark 4, the oxide layer around the alignment mark 4 occupies an area roughly 3 to 6 times the area of oxide layer between two neighboring semiconductor devices in the main circuit area 4.

Next, as shown in FIG. 2D, an oxide chemical-mechanical polishing (Oxide-CMP) operation is performed to remove a portion of the oxide layer 16 above the silicon nitride layer 14. However, it is difficult to remove all oxide material from the surface by using a chemical-mechanical polishing method, especially when the surface of the oxide layer has an array profile or a large surface area. Since the oxide layer 16 has array profile above the alignment mark 4 and the side of the alignment mark 12 is surrounded by large area of oxide material, some residual oxide material 18 will remain over the silicon nitride layer 14 above the array profile after the CMP operation.

Next, as shown in FIG. 2E, the silicon nitride layer 14 is removed using hot phosphoric acid solution, for example.

Finally, as shown in FIG. 2F, traces of the oxide layer 18 are removed using, for example, photolithographic and etching operations with fluorine deficient plasma. In other words, a plasma having a fluorine to carbon (F/C) ratio of less than 4 is used to etch away the oxide material 18 above the alignment mark 4. The process is known as an oxide clearout photo operation.

In the conventional method, the alignment marks is overshadowed by an array profile and a wide area of surrounding oxide material. Therefore, when an oxide chemical-mechanical polishing operation is carried out, oxide material above the silicon nitride layer close to the alignment mark region is difficult to remove. After the silicon nitride layer is removed, this residual oxide material remains on the alignment mark. The residual oxide material can cause a shift in the overlay structure during subsequent mask alignment operation. Consequently, extra oxide clearout operations may have to be carried out for removing the unwanted oxide material. In light of the foregoing, there is a need for an improved method of forming alignment marks on a silicon wafer.

SUMMARY OF THE INVENTION

Accordingly, the present invention provides a method of manufacturing shallow trench isolation alignment mark that requires no extra oxide clearout photo operations for preventing a shift in overlay structure during subsequent photo-alignment operation.

To achieve these and other advantages and in accordance with the purpose of the invention, as embodied and broadly described herein, the invention provides a method of manufacturing a shallow trench isolation alignment mark. The method includes the steps of first providing a silicon wafer whose surface has an alignment mark formed thereon. Next, a silicon nitride layer is formed over the silicon wafer, and then shallow trenches are formed. At least one of the shallow trenches is positioned at a distance of roughly 2000 Å to 10000 Å from the edge of the alignment mark. Thereafter, an oxide layer is formed over the silicon nitride layer, and then a chemical-mechanical polishing operation is conducted to remove a portion of the oxide layer and silicon nitride layer above the alignment mark. Altogether, a layer of silicon nitride preferably having a thickness of about 600 Å is removed from the top of the alignment mark. Finally, the silicon nitride layer is also removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
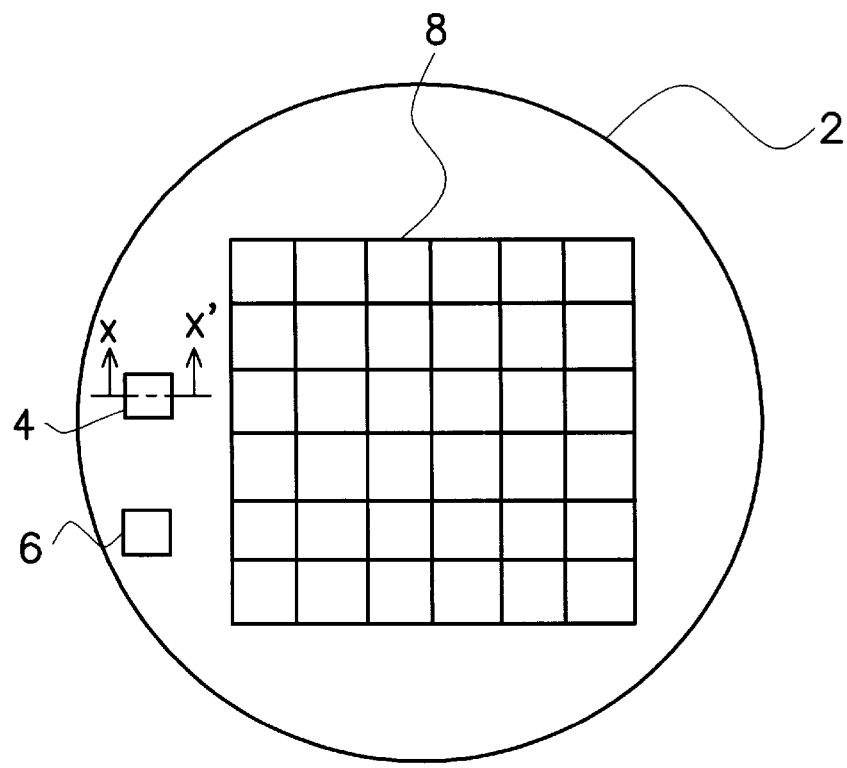
FIG. 1 is a sketch of a silicon wafer having alignment marks formed thereon.
Figure 2A:
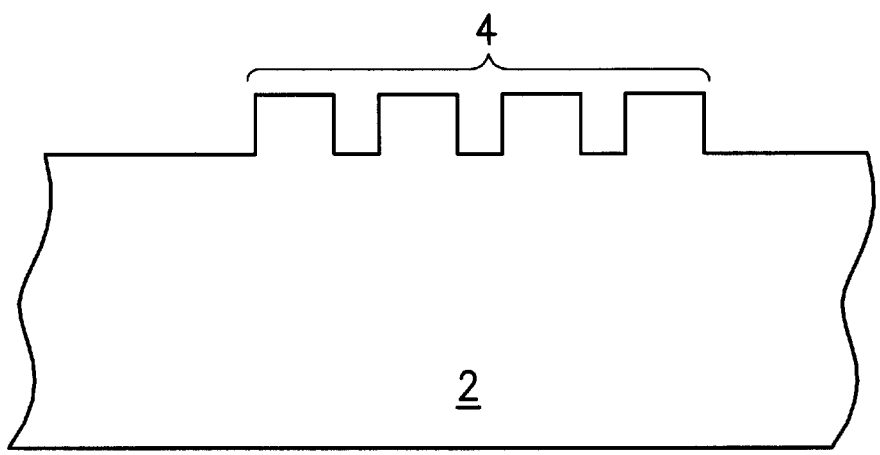
FIGS. 2A through 2F are cross-sectional views along line X—X' of FIG. 1 showing the progression of manufacturing steps in producing an alignment mark in a wafer according to a conventional method.
Figure 2B:
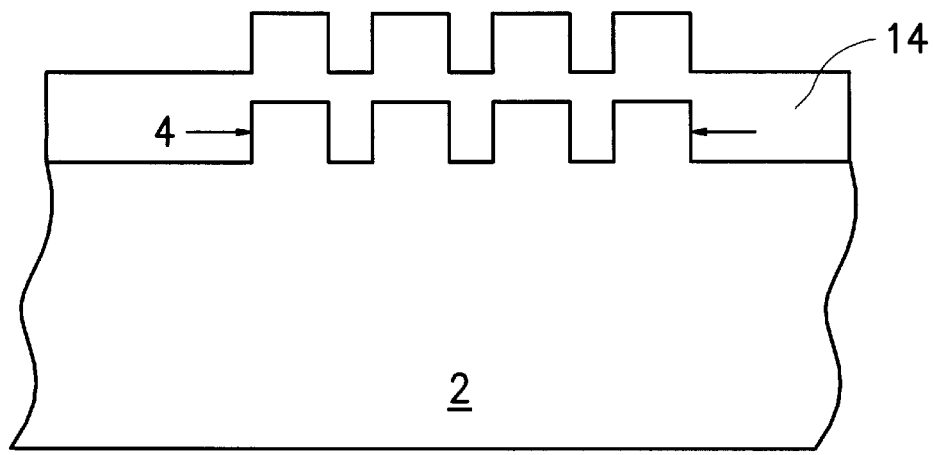
Figure 2C:
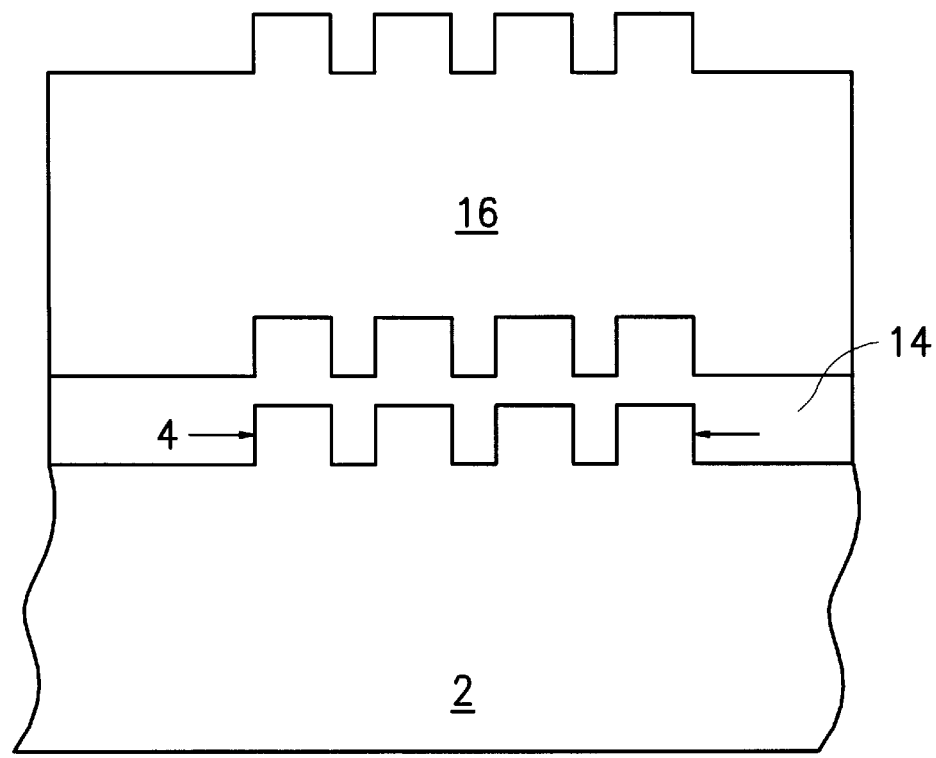
Figure 2D:
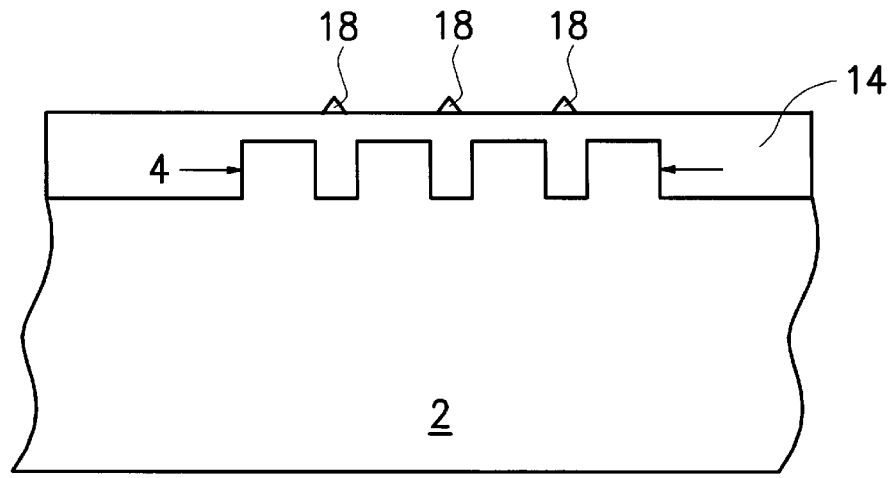
Figure 2E:
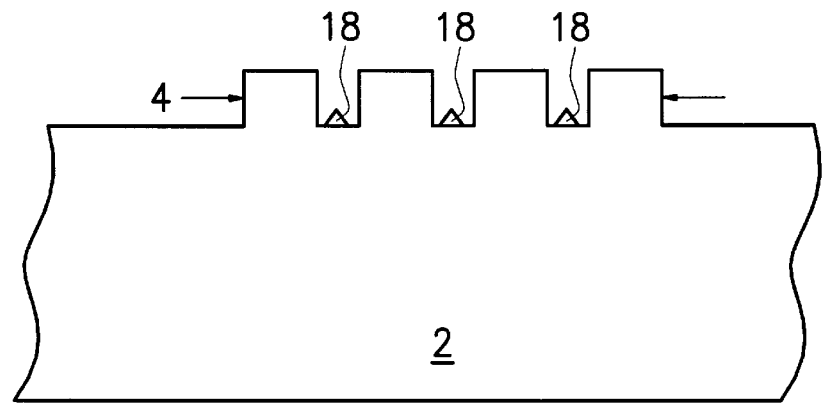
Figure 2F:
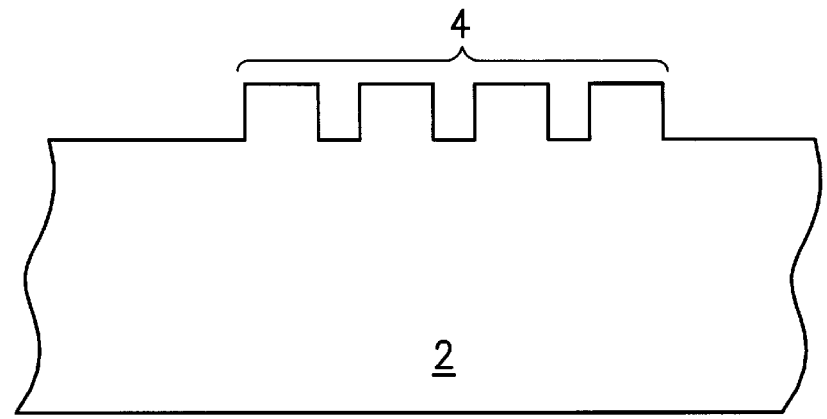

Reference will now be made in detail to the present preferred embodiments of he invention, examples of which are illustrated in the accompanying drawings, wherever possible, the same reference numbers are used in the drawings and the description to refer to the same or like parts.

FIGS. 3A through 3E are schematic, cross-sectional views showing the progression of manufacturing steps in producing a shallow trench isolation alignment mark according to one preferred embodiment of this invention.

Figure 3A:
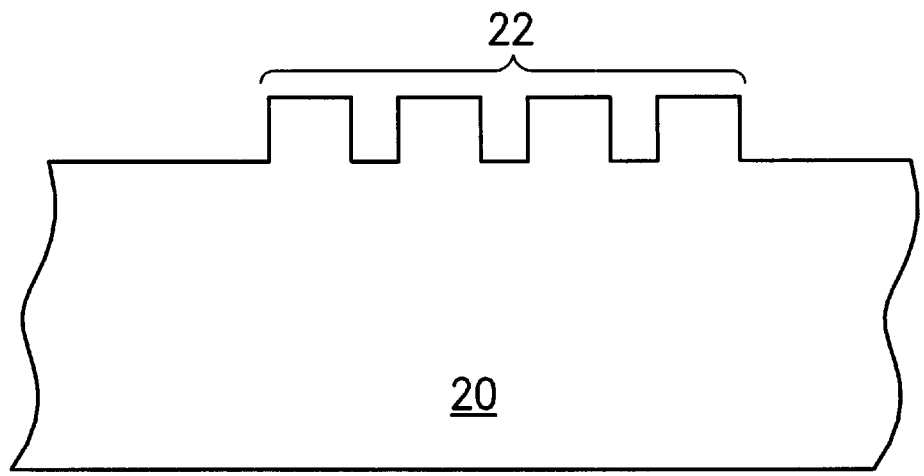
FIGS. 3A through 3E are cross-sectional views showing the progression of manufacturing steps in producing a shallow trench isolation alignment mark according to one preferred embodiment of this invention.

First, a silicon wafer 20 having an alignment mark 22 shaped into an array profile is provided as shown in FIG. 3A. The alignment mark 22 preferably has a thickness of about 1200 Å and occupies an area of about 539 $\mu m^2$. Moreover, the alignment mark 22 is preferably positioned near the edge of the wafer 20.

Figure 3B:
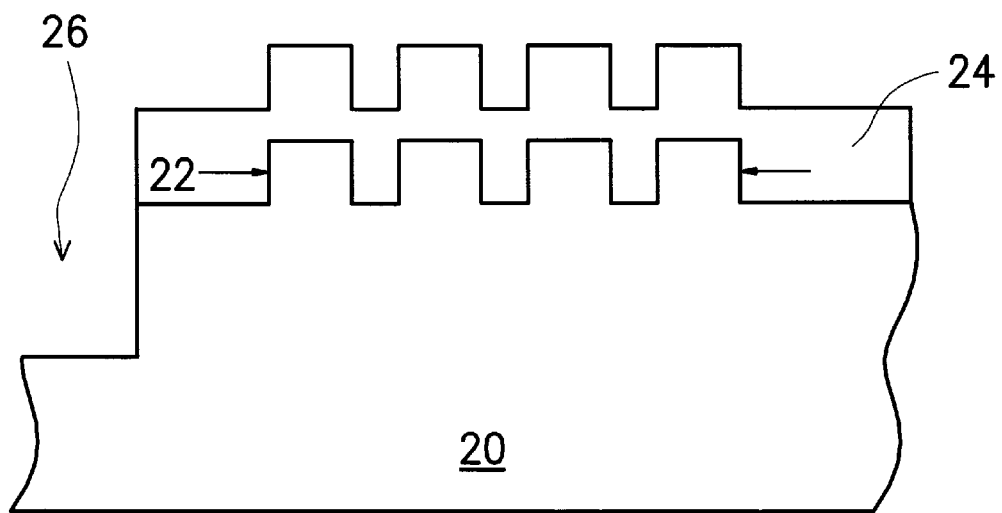

Next, as shown in FIG. 3B, a silicon nitride layer 24 is formed over the wafer 20. The silicon nitride layer 24 preferably having a thickness of about 2000 Å is formed using a low-pressure chemical vapor deposition (LPCVD) method. The silicon nitride layer 24 formed by the LPCVD method has a good step coverage. Hence, the array profile on silicon nitride layer 24 above the alignment mark 22 can be maintained. Thereafter, a shallow trench 26 having an area of about 1.6 mm$^2$ and depth preferably of about 6000 Å is formed on the wafer 20 surface at a distance of about 2000 Å to 10000 Å from the edge of the alignment mark 22. A portion of the silicon nitride layer 24 can be removed to form the shallow trench 26 using, for example, photolithographic and dry etching methods.

Figure 3C:
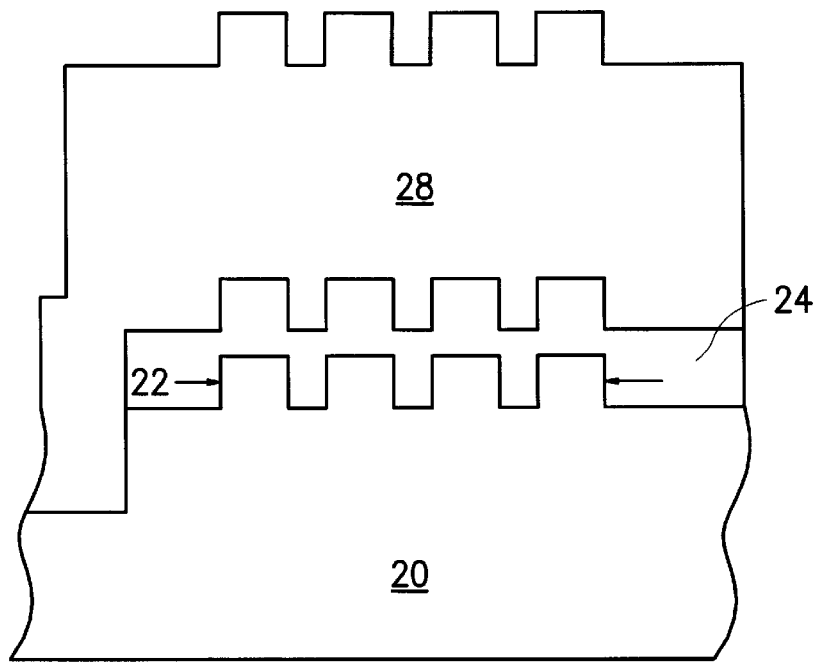

Next, as shown in FIG. 3C, an oxide layer 28 is formed that fills the shallow trench 26 and covers the silicon nitride layer 24. The oxide layer 28 preferably has a thickness of about 7000 Å. The oxide layer 28 can be deposited using, for example, an atmospheric pressure chemical vapor deposition (APCVD) method with tetra-ethyl-ortho-silicate (TEOS) as a reactive agent. The oxide layer 28 formed by the APCVD method has good step coverage, and hence an array profile can be maintained on the oxide layer 28 above the alignment mark 22.

Figure 3D:
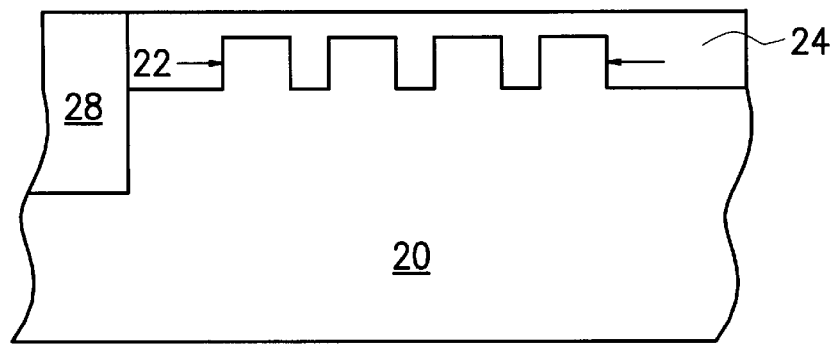

Next, as shown in FIG. 3D, an oxide chemical-mechanical polishing operation is carried out to polish away a portion of the oxide layer 28 above the silicon nitride layer 24 and a portion of the silicon nitride layer 24 itself. Preferably, a layer of silicon nitride layer 24 having an overall thickness of about 600 Å is removed so that no residual oxide material will cling to the top of the silicon nitride layer 24 above the alignment mark 22. Hence, when the silicon nitride layer 24 is subsequently removed, the alignment mark 22 will not be damaged. Note also that as the distance between the shallow trench 26 and the alignment mark 22 gets closer, the polishing rate in the CMP operation will increase.

Figure 3E:
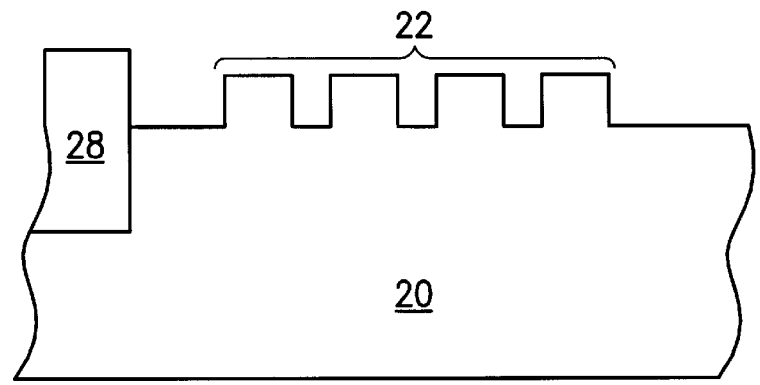

Finally, as shown in FIG. 3E, the silicon nitride layer 24 is removed using hot phosphoric acid solution, for example.

In summary, the advantages of using the method of this invention include:

First, By forming a shallow trench 26 at a distance of between 2000 Å to 10000 Å from the edge of an alignment mark 22, a subsequently performed oxide chemical-mechanical polishing operation is capable of removing all the residual oxide material on the silicon nitride layer 24 above the alignment mark 22. Hence, there is no need to perform extra oxide clearout operations as in a conventional method.

Second, Due to the presence of trench 26 close to the alignment mark 22, the chemical-mechanical polishing rate for removing oxide material is also increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing shallow trench isolation alignment mark, comprising the steps of:

providing a silicon wafer that has an alignment mark already formed thereon;

forming a silicon nitride layer over the silicon wafer;

forming a plurality of shallow trenches with at least one shallow trench formed at a distance of about 2000 Å to 10000 Å from the edge of the alignment mark;

forming an oxide layer over the silicon nitride layer;

performing a chemical-mechanical polishing operation to remove a portion of the oxide layer and a portion of the silicon nitride layer so that a layer of silicon nitride layer above the alignment mark with a thickness of about 600 Å is removed from the top; and removing the silicon nitride layer.

2. The method of claim 1, wherein the alignment mark has a height of about 1200 Å.

3. The method of claim 1, wherein the step of forming the silicon nitride layer includes using a low-pressure chemical vapor deposition method.

4. The method of claim 1, wherein the silicon nitride layer has a thickness of bout 2000 Å.

5. The method of claim 1, wherein the shallow trench has a depth of about 6000 Å.

6. The method of claim 1, wherein the step of forming the oxide layer includes using an atmospheric pressure chemical vapor deposition method.

7. The method of claim 1, wherein the step of forming the oxide layer includes depositing tetra-ethyl-ortho-silicate.

8. The method of claim 1, wherein the oxide layer has a thickness of about 7000 Å.

9. The method of claim 1, wherein the alignment mark occupies an area of about 539 $\mu m^2$.

10. The method of claim 1, wherein the shallow trench at the edge of the alignment mark occupies an area of about 1.6 mm$^2$.

* * * * *